US011296601B2

(12) United States Patent
Kinzer

(10) Patent No.: US 11,296,601 B2
(45) Date of Patent: Apr. 5, 2022

(54) POWER TRANSISTOR WITH DISTRIBUTED GATE

(71) Applicant: Navitas Semiconductor, Inc., El Segundo, CA (US)

(72) Inventor: Daniel M. Kinzer, El Segundo, CA (US)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 16/813,733

(22) Filed: Mar. 9, 2020

(65) Prior Publication Data

US 2020/0212804 A1   Jul. 2, 2020

Related U.S. Application Data

(63) Continuation of application No. 14/831,742, filed on Aug. 20, 2015, now Pat. No. 10,587,194.

(Continued)

(51) Int. Cl.
*H02M 3/158* (2006.01)
*H02M 1/088* (2006.01)
(Continued)

(52) U.S. Cl.
CPC ........ *H02M 3/158* (2013.01); *H01L 23/4824* (2013.01); *H01L 23/528* (2013.01); *H01L 23/5226* (2013.01); *H01L 27/0605* (2013.01); *H01L 27/0629* (2013.01); *H01L 29/41758* (2013.01); *H01L 29/7786* (2013.01); *H01L 29/872* (2013.01); *H02M 1/088* (2013.01);
(Continued)

(58) Field of Classification Search
CPC ...... H02M 3/158; H02M 1/088; H02M 1/096; H01L 23/4824; H01L 29/41758; H01L 29/7786; H01L 23/5226; H01L 23/528; H01L 27/0605; H01L 27/0629; H01L 29/872; H01L 29/861; H01L 27/088; H01L 29/2003; H03K 17/6871
USPC ......................................................... 323/271
See application file for complete search history.

(56) References Cited

U.S. PATENT DOCUMENTS

| 4,616,142 A | 10/1986 | Upadhyay et al. |
| 5,801,572 A | 9/1998 | Nakamura et al. |

(Continued)

FOREIGN PATENT DOCUMENTS

| CN | 103078616 A | 5/2013 |
| CN | 103312148 A | 9/2013 |

(Continued)

OTHER PUBLICATIONS

Office Action for TW108144744 dated Apr. 24, 2020, 3 pages.

(Continued)

*Primary Examiner* — Metasebia T Retebo
(74) *Attorney, Agent, or Firm* — Kilpatrick Townsend & Stockton LLP

(57) ABSTRACT

An electronic circuit is disclosed. The electronic circuit includes a distributed power switch. In some embodiments, the electronic circuit also includes one or more of a distributed gate driver, a distributed gate pulldown device, a distributed diode, and a low resistance gate and/or source connection structure. An electronic component comprising the circuit, and methods of manufacturing the circuit are also disclosed.

18 Claims, 11 Drawing Sheets

Related U.S. Application Data

(60) Provisional application No. 62/039,742, filed on Aug. 20, 2014.

(51) Int. Cl.

| | | |
|---|---|---|
| *H01L 23/482* | (2006.01) | |
| *H02M 1/096* | (2006.01) | |
| *H01L 29/417* | (2006.01) | |
| *H01L 29/778* | (2006.01) | |
| *H01L 23/522* | (2006.01) | |
| *H01L 23/528* | (2006.01) | |
| *H01L 27/06* | (2006.01) | |
| *H01L 29/872* | (2006.01) | |
| *H03K 17/687* | (2006.01) | |
| *H01L 29/861* | (2006.01) | |
| *H01L 27/088* | (2006.01) | |
| *H01L 29/20* | (2006.01) | |

(52) U.S. Cl.
CPC ........ *H02M 1/096* (2013.01); *H03K 17/6871* (2013.01); *H01L 27/088* (2013.01); *H01L 29/2003* (2013.01); *H01L 29/861* (2013.01); *H01L 2924/0002* (2013.01)

(56) References Cited

U.S. PATENT DOCUMENTS

| | | | |
|---|---|---|---|
| 5,961,215 A | 10/1999 | Lee et al. | |
| 6,255,867 B1 | 7/2001 | Chen | |
| 8,604,841 B2 | 12/2013 | Lobsiger et al. | |
| 9,087,812 B2 | 7/2015 | Briere | |
| 10,587,194 B2 | 3/2020 | Kinzer | |
| 2004/0207968 A1 | 10/2004 | Martin et al. | |
| 2006/0081897 A1 | 4/2006 | Yoshida et al. | |
| 2006/0118809 A1 | 6/2006 | Parikh et al. | |
| 2006/0220699 A1 | 10/2006 | Labbe et al. | |
| 2007/0162755 A1 | 7/2007 | Costa-Requena et al. | |
| 2007/0236850 A1 | 10/2007 | Kuhn et al. | |
| 2007/0241418 A1 | 10/2007 | Wang et al. | |
| 2008/0094870 A1 | 4/2008 | Tsujimura et al. | |
| 2010/0019279 A1 | 1/2010 | Chen et al. | |
| 2010/0109645 A1 | 5/2010 | Park et al. | |
| 2010/0128898 A1 | 5/2010 | Wong | |
| 2010/0148718 A1 | 6/2010 | Kitabatake et al. | |
| 2011/0025397 A1 | 2/2011 | Wang et al. | |
| 2011/0210337 A1 | 9/2011 | Briere | |
| 2011/0210338 A1 | 9/2011 | Briere | |
| 2011/0284862 A1 | 11/2011 | Zhang | |
| 2012/0068678 A1 | 3/2012 | Hatae et al. | |
| 2012/0273797 A1 | 11/2012 | Okada et al. | |
| 2013/0087803 A1 | 4/2013 | Kizilyalli et al. | |
| 2013/0106469 A1* | 5/2013 | Slavov .................. | H03K 17/18 327/109 |
| 2013/0147374 A1 | 6/2013 | Kim et al. | |
| 2013/0241520 A1* | 9/2013 | Kim .................... | H03K 17/687 323/311 |
| 2013/0248883 A1 | 9/2013 | Das et al. | |
| 2013/0342184 A1 | 12/2013 | Briere et al. | |
| 2014/0055170 A1 | 2/2014 | Liang et al. | |
| 2014/0077266 A1 | 3/2014 | Ramdani et al. | |
| 2014/0138701 A1 | 5/2014 | Huang et al. | |
| 2014/0209861 A1 | 7/2014 | Okamoto et al. | |
| 2014/0312458 A1 | 10/2014 | Ashrafzadeh et al. | |
| 2014/0340124 A1 | 11/2014 | Mauder et al. | |
| 2015/0084118 A1 | 3/2015 | Van et al. | |
| 2016/0056721 A1 | 2/2016 | Kinzer | |
| 2016/0056817 A1 | 2/2016 | Kinzer | |
| 2016/0079854 A1 | 3/2016 | Kinzer et al. | |

FOREIGN PATENT DOCUMENTS

| | | |
|---|---|---|
| CN | 106796930 A | 5/2017 |
| TW | 442954 B | 6/2001 |
| TW | 484226 B | 4/2002 |
| TW | I271845 B | 1/2007 |
| TW | 201330000 A | 1/2013 |
| TW | 201303889 A | 7/2013 |
| TW | 201421648 B | 6/2014 |
| TW | 201620110 B | 6/2016 |
| TW | I627723 B | 6/2018 |
| TW | I682515 B | 1/2020 |
| WO | 2011079194 A2 | 6/2011 |
| WO | 2016028967 A1 | 2/2016 |

OTHER PUBLICATIONS

U.S. Appl. No. 14/831,742 , "Advisory Action", dated Apr. 19, 2018, 3 pages.
U.S. Appl. No. 14/831,742 , "Advisory Action", dated May 19, 2017, 3 pages.
U.S. Appl. No. 14/831,742 , "Final Office Action", dated Feb. 8, 2018, 12 pages.
U.S. Appl. No. 14/831,742 , "Final Office Action", dated Feb. 27, 2017, 14 pages.
U.S. Appl. No. 14/831,742 , "Final Office Action", dated Jul. 10, 2019, 16 pages.
U.S. Appl. No. 14/831,742 , "Non Final Office Action", dated Oct. 21, 2016, 11 pages.
U.S. Appl. No. 14/831,742 , "Non Final Office Action", dated Jul. 26, 2018, 12 pages.
U.S. Appl. No. 14/831,742 , "Non-Final Office Action", dated Jul. 27, 2017, 11 pages.
U.S. Appl. No. 14/831,742 , "Non-Final Office Action", dated Jan. 24, 2019, 15 pages.
U.S. Appl. No. 14/831,742 , "Notice of Allowance", dated Nov. 6, 2019, 8 pages.
U.S. Appl. No. 14/831,758 , "Advisory Action", dated Mar. 19, 2019, 2 pages.
U.S. Appl. No. 14/831,758 , "Advisory Action", dated May 9, 2017, 2 pages.
U.S. Appl. No. 14/831,758 , "Advisory Action", dated Apr. 10, 2018, 3 pages.
U.S. Appl. No. 14/831,758 , "Final Office Action", dated Jan. 14, 2019, 11 pages.
U.S. Appl. No. 14/831,758 , "Final Office Action", dated Jan. 24, 2018, 12 pages.
U.S. Appl. No. 14/831,758 , "Final Office Action", dated Jun. 28, 2019, 12 pages.
U.S. Appl. No. 14/831,758 , "Final Office Action", dated Feb. 1, 2017, 7 pages.
U.S. Appl. No. 14/831,758 , "Non Final Office Action", dated Nov. 23, 2016, 8 pages.
U.S. Appl. No. 14/831,758 , "Non-Final Office Action", dated Aug. 30, 2018, 11 pages.
U.S. Appl. No. 14/831,758 , "Non-Final Office Action", dated Sep. 14, 2017, 11 pages.
U.S. Appl. No. 14/831,758 , "Non-Final Office Action", dated May 20, 2019, 12 pages.
Chinese Application Publication No. CN201580053363.4 , "Office Action", dated Jun. 4, 2019, 14 pages.
Chinese Application Publication No. CN201580053363.4 , "Office Action", dated Nov. 7, 2019, 14 pages.
Chinese Application Publication No. CN201580053363.4 , "Office Action", dated Sep. 27, 2018, 19 pages.
PCT/US2015/046022 , "International Preliminary Report on Patentability", dated Mar. 2, 2017, 11 pages.
PCT/US2015/046022 , "International Search Report and Written Opinion", dated Nov. 27, 2015, 12 pages.
Taiwanese Patent Application No. TW104127245 , "Notice of Decision to Grant", dated Mar. 31, 2018, 3 pages.
Taiwanese Patent Application No. TW104127245 , "Office Action", dated Nov. 30, 2017, 8 pages.
Taiwanese Patent Application No. TW107115747 , "Notice of Decision to Grant", dated Sep. 9, 2019, 3 pages.
Taiwanese Patent Application No. TW107115747 , "Office Action", dated Jan. 23, 2019, 15 pages.

(56) References Cited

OTHER PUBLICATIONS

Taiwanese Patent Application No. TW107115747, "Office Action", dated Oct. 8, 2018, 8 pages.

* cited by examiner

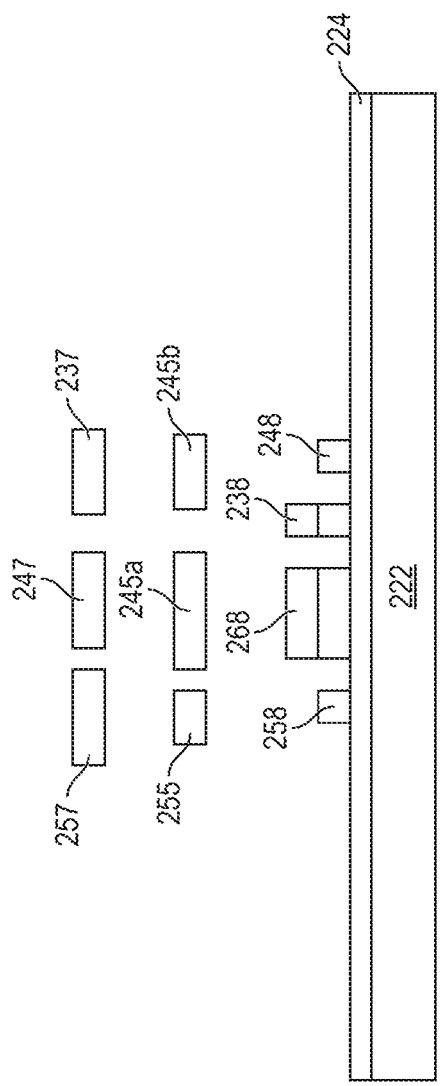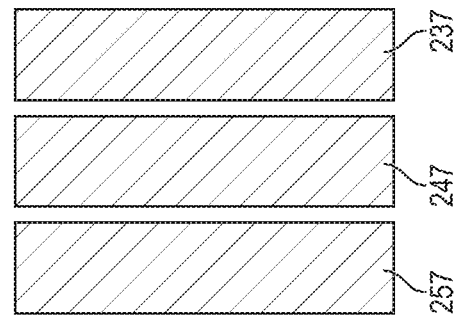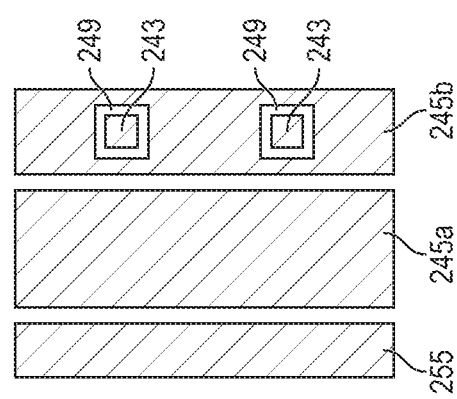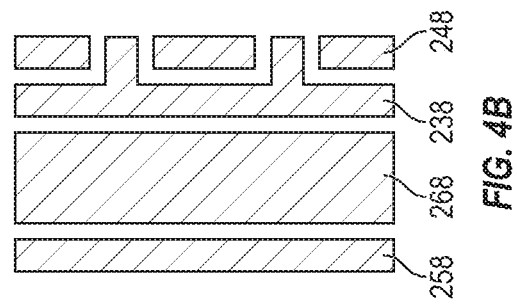

POWER TRANSISTOR WITH DISTRIBUTED GATE

CROSS-REFERENCES TO RELATED APPLICATIONS

This application is a continuation of U.S. application Ser. No. 14/831,742, entitled "POWER TRANSISTOR WITH DISTRIBUTED GATE" filed on Aug. 20, 2015, which claims the benefit of U.S. provisional patent application Ser. No. 62/039,742, entitled "POWER TRANSISTOR WITH DISTRIBUTED SCHOTTKY DIODE AND LOW Rg" filed on Aug. 20, 2014, which is hereby incorporated by reference in its entirety for all purposes.

FIELD OF THE INVENTION

The present invention relates generally to transistors and in particular to power transistors formed in GaN-based technologies.

BACKGROUND OF THE INVENTION

Electronic devices such as computers, servers and televisions, among others, employ one or more electrical power conversion circuits to convert one form of electrical energy to another. The efficiency of this conversion is critical to avoid wasted energy and reduce waste heat generation. An example of a circuit topology that requires high frequency switching is a half bridge converter. New components with higher speed and efficiency are needed for converter circuits to meet the needs of new electronic devices. In addition, power transistors that can switch extremely fast are needed to enable frequency to increase without loss of efficiency. High frequency switching will reduce the size and cost of power electronic systems. However, conventional devices rely on drivers that are external to chip, and usually also to the package that houses the power transistor. In addition, the routing of interconnect on chip is inefficient, resulting in a gate resistance that is usually in the range of 1-10 ohms, which limits the switching speed and efficiency. GaN technology enables power transistors to be designed that are much smaller than conventional silicon devices, and capacitance can be reduced by 10-20 times. Because of this, GaN devices switch extremely fast, which can be hard to control with conventional gate drive circuits. It is essential to reduce the impedance between the driver and the power transistor as low as possible to enable good control of the switching operation.

SUMMARY OF THE INVENTION

One inventive aspect is an electronic circuit. The electronic circuit includes a substrate including GaN, and a distributed power switch formed on the substrate, where the distributed power switch includes a plurality of sub-transistors, and where each sub-transistor includes a gate, a source, and a drain. The electronic circuit also includes a distributed drive circuit formed on the substrate, where the distributed drive circuit includes a distributed output stage formed by a plurality of sub-drivers, where each sub-driver includes an input and an output, and where the output of each sub-driver is connected to a gate of one or more corresponding sub-transistors of the sub-transistors of the distributed power switch.

Another inventive aspect is an electronic component, including a package base, and at least one GaN-based die secured to the package base and including an electronic circuit. The electronic circuit includes a substrate including GaN, and a distributed power switch formed on the substrate, where the distributed power switch includes a plurality of sub-transistors, and where each sub-transistor includes a gate, a source, and a drain. The electronic circuit also includes a distributed drive circuit formed on the substrate, where the distributed drive circuit includes a distributed output stage formed by a plurality of sub-drivers, where each sub-driver includes an input and an output, and where the output of each sub-driver is connected to a gate of one or more corresponding sub-transistors of the sub-transistors of the distributed power switch.

Another inventive aspect is an electronic circuit. The electronic circuit includes a substrate including GaN, and a distributed power switch formed on the substrate, where the distributed power switch includes a plurality of power sub-transistors, and where each power sub-transistor includes a gate, a source, and a drain. The electronic circuit also includes a distributed pulldown transistor formed on the substrate, where the distributed pulldown transistor includes a plurality of pulldown sub-transistors, where each pulldown sub-transistor includes a gate, a source, and a drain. The gates of the pulldown sub-transistors are electrically connected together, the sources of the pulldown sub-transistors are each connected to a source of one or more corresponding power sub-transistors, and the drains of the pulldown sub-transistors are each connected to a gate of the corresponding power sub-transistors.

Another inventive aspect is an electronic component, including a package base, and at least one GaN-based die secured to the package base and including an electronic circuit The electronic circuit includes a substrate including GaN, and a distributed power switch formed on the substrate, where the distributed power switch includes a plurality of power sub-transistors, and where each power sub-transistor includes a gate, a source, and a drain. The electronic circuit also includes a distributed pulldown transistor formed on the substrate, where the distributed pulldown transistor includes a plurality of pulldown sub-transistors, where each pulldown sub-transistor includes a gate, a source, and a drain. The gates of the pulldown sub-transistors are electrically connected together, the sources of the pulldown sub-transistors are each connected to a source of one or more corresponding power sub-transistors, and the drains of the pulldown sub-transistors are each connected to a gate of the corresponding power sub-transistors.

Another inventive aspect is an electronic circuit. The electronic circuit includes a substrate including GaN, and a distributed power switch formed on the substrate, where the distributed power switch includes a plurality of power sub-transistors, and where each power sub-transistor includes a gate electrode, a source electrode, and a drain electrode. The electronic circuit also includes a first conductor connected to the gate electrodes of the power sub-transistors, a second conductor connected to the source electrodes of the power sub-transistors, and a third conductor overlapping at least a portion of the second conductor, where the third conductor includes a first portion connected to the second conductor with one or more vias, and a second portion connected to the first conductor with one or more vias. The electronic circuit also includes a fourth conductor overlapping the second portion of the third conductor, and connected to the first conductor by the second portion of the third conductor, where the fourth conductor has a thickness of at least 2 microns.

Another inventive aspect is an electronic component, including a package base, and at least one GaN-based die secured to the package base and including an electronic circuit. The electronic circuit includes a substrate including GaN, and a distributed power switch formed on the substrate, where the distributed power switch includes a plurality of power sub-transistors, and where each power sub-transistor includes a gate electrode, a source electrode, and a drain electrode. The electronic circuit also includes a first conductor connected to the gate electrodes of the power sub-transistors, a second conductor connected to the source electrodes of the power sub-transistors, and a third conductor overlapping at least a portion of the second conductor, where the third conductor includes a first portion connected to the second conductor with one or more vias, and a second portion connected to the first conductor with one or more vias. The electronic circuit also includes a fourth conductor overlapping the second portion of the third conductor, and connected to the first conductor by the second portion of the third conductor, where the fourth conductor has a thickness of at least 2 microns.

BRIEF DESCRIPTION OF THE DRAWINGS

FIGS. 4A-4D are schematic illustrations of a portion of an embodiment of a layout of a distributed transistor.

DETAILED DESCRIPTION OF THE INVENTION

Certain embodiments of the present invention are implemented in half bridge power conversion circuits that employ one or more gallium nitride (GaN) devices. While the present invention can be useful for a wide variety of circuits, some embodiments of the invention are particularly useful for half bridge circuits designed to operate at high frequencies and/or high efficiencies with integrated driver circuits, integrated level shift circuits, integrated bootstrap capacitor charging circuits, integrated startup circuits and/or hybrid solutions using GaN and silicon devices.

Figure 1:
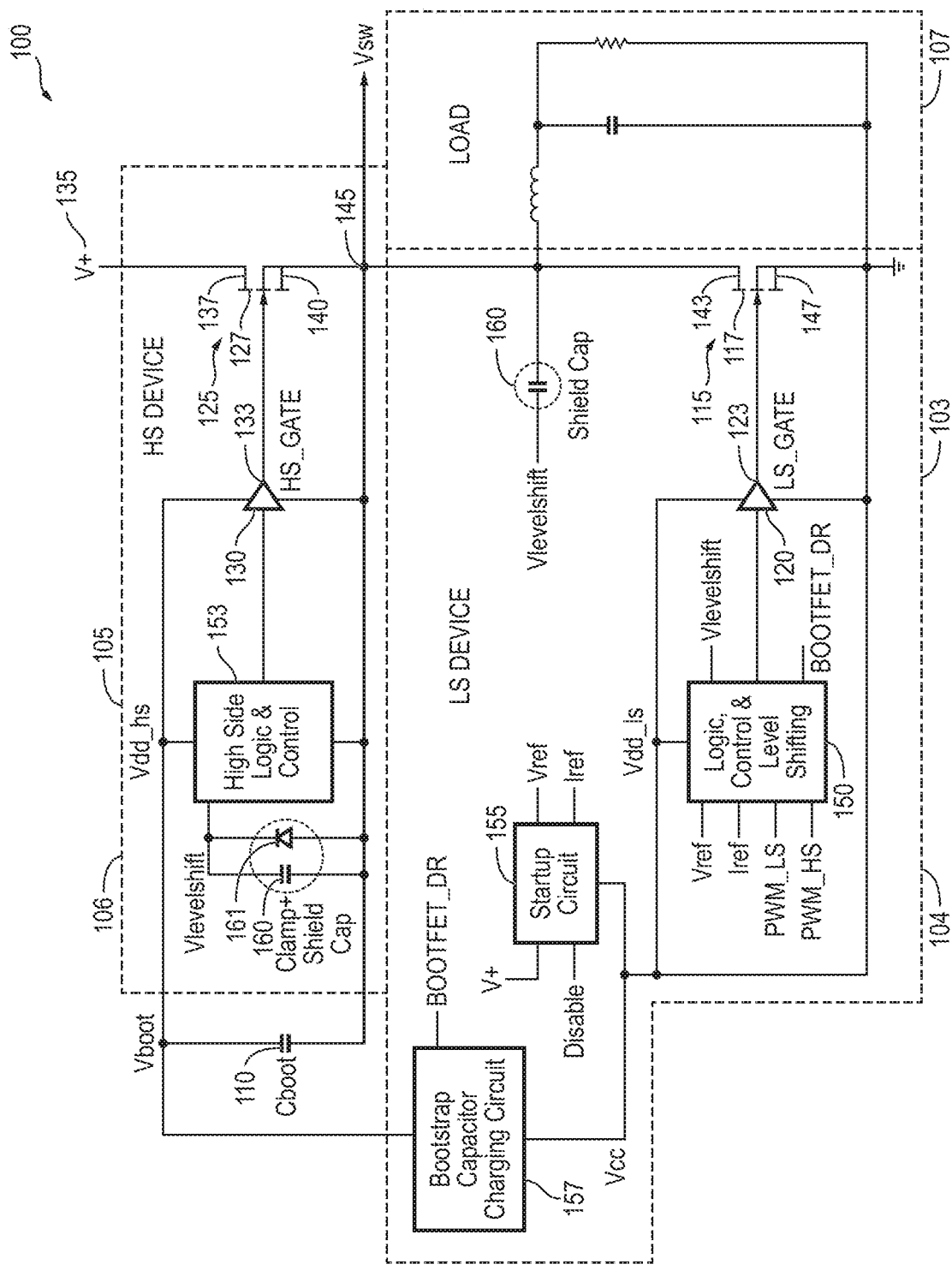
FIG. 1 is a simplified schematic of a half bridge power conversion circuit.

Now referring to FIG. 1, in some embodiments, circuit 100 may include a pair of complementary power transistors (also referred to herein as switches) that are controlled by one or more control circuits configured to regulate power delivered to a load. In some embodiments a high side power transistor is disposed on a high side device along with a portion of the control circuit and a low side power transistor is disposed on a low side device along with a portion of the control circuit, as described in more detail below.

The integrated half bridge power conversion circuit 100 illustrated in FIG. 1 includes a low side GaN device 103, a high side GaN device 105 a load 107, a bootstrap capacitor 110 and other circuit elements, as illustrated and discussed in more detail below. Some embodiments may also have an external controller (not shown in FIG. 1) providing one or more inputs to circuit 100 to regulate the operation of the circuit. Circuit 100 is for illustrative purposes only and other variants and configurations are within the scope of this disclosure.

In one embodiment, low side GaN device 103 may have a GaN-based low side circuit 104 that includes a low side power transistor 115 having a low side control gate 117. Low side circuit 104 may further include an integrated low side transistor driver 120 having an output 123 connected to low side transistor control gate 117. In another embodiment high, side GaN device 105 may have a GaN-based high side circuit 106 that includes a high side power transistor 125 having a high side control gate 127. High side circuit 106 may further include an integrated high side transistor driver 130 having an output 133 connected to high side transistor control gate 127.

A voltage source 135 (also known as a rail voltage) may be connected to a drain 137 of high side transistor 125, and the high side transistor may be used to control power input into power conversion circuit 100. High side transistor 125 may further have a source 140 that is coupled to a drain 143 of low side transistor 115, forming a switch node 145. Low side transistor 115 may have a source 147 connected to ground. In one embodiment, low side transistor 115 and high side transistor 125 may be GaN-based enhancement-mode field effect transistors. In other embodiments low side transistor 115 and high side transistor 125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 105 and low side device 103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN. In further embodiments, GaN-based low side circuit 104 and GaN-based high side circuit 106 may be disposed on a monolithic GaN-based device. In other embodiments GaN-based low side circuit 104 may be disposed on a first GaN-based device and GaN-based high side circuit 106 may be disposed on a second GaN-based device. In yet further embodiments, GaN-based low side circuit 104 and GaN-based high side circuit 106 may be disposed on more than two GaN-based devices. In one embodiment, GaN-based low side circuit 104 and GaN-based high side circuit 106 may contain any number of active or passive circuit elements arranged in any configuration.

In some embodiments, half bridge power conversion circuit 100 is formed are on a GaN-based die secured to a package base of an electronic power conversion component. In some embodiments, the component includes multiple GaN-based die secured to the package base.

The components of integrated half bridge power conversion circuit 100 may include features as described in further detail in U.S. application Ser. No. 14/737,259, filed Jun. 11, 2015, which is incorporated herein in its entirety for all purposes.

Figure 2:
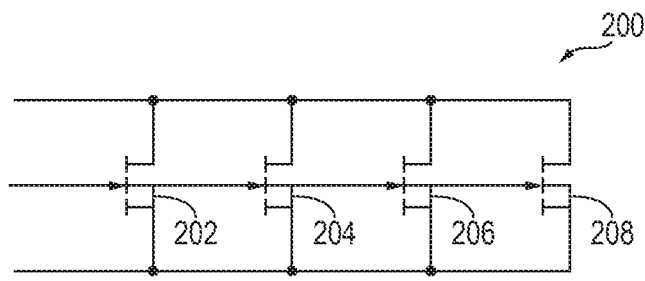
FIG. 2 is a schematic illustration of a distributed transistor.

In some embodiments of integrated half bridge power conversion circuit 100, either or both of power transistors 115 and 125 may be implemented with a distributed or fingered topology. For example, FIG. 2 is a schematic illustration of a transistor 200 having such a topology. Transistor 200 includes three sub-transistors 202, 204, 206, and 208. As shown, sub-transistors 202, 204, 206, and 208 have their respective drains, gates, and sources connected respectively to nodes D, G, and S, which respectively correspond with the drain, gate, and source of transistor 200.

Figure 3A:
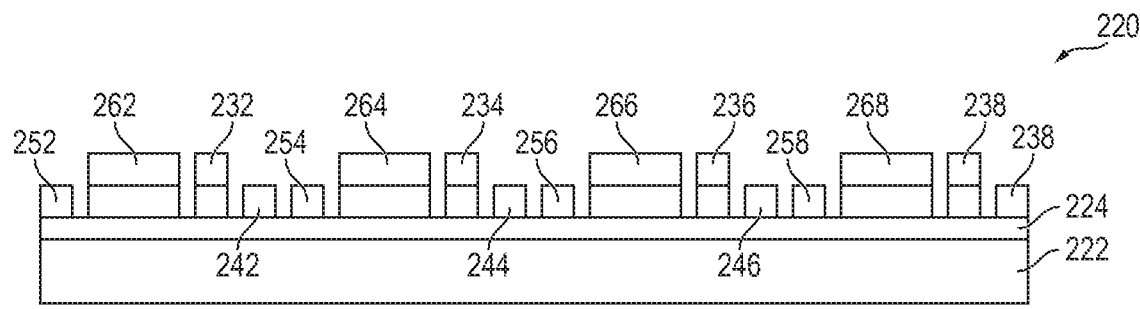
FIGS. 3A and 3B are schematic illustrations of a portion of an embodiment of a layout of a distributed transistor.
Figure 3B:
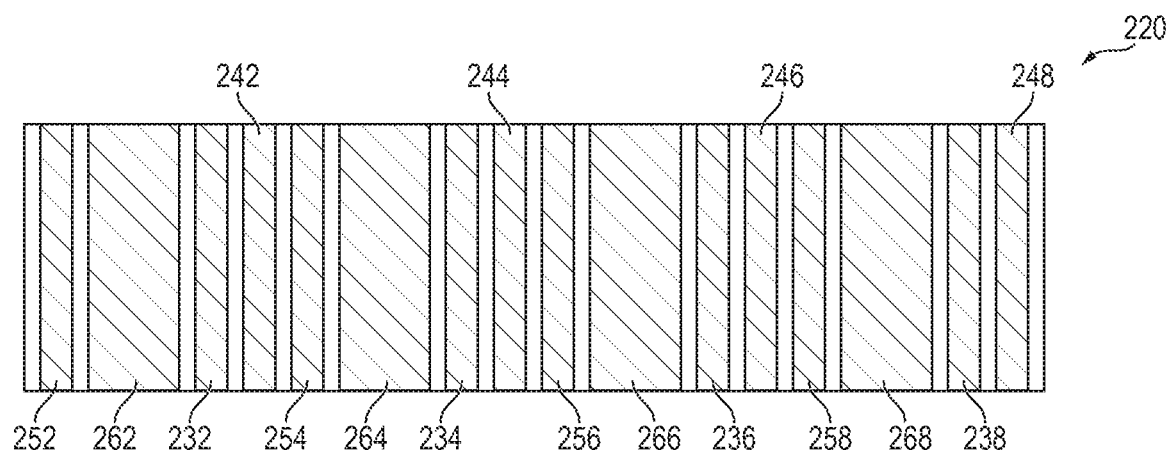

FIGS. 3A and 3B are schematic illustrations of a portion 220 of an embodiment of a layout of transistor 200. The embodiment of FIGS. 3A and 3B is provided as an example only. Numerous alternative layout configurations for transistor 200 are additionally contemplated.

Source electrode fingers 242, 244, 246, and 248 each form an ohmic contact with the underlying AlGaN or similar layer 224 on substrate 222 and collectively form the source electrode of transistor 200. Source electrode fingers 242, 244, 246, and 248 respectively form the source electrodes of sub-transistors 202, 204, 206, and 208. The source electrode fingers 242, 244, 246, and 248 are electrically connected to one another and to one or more pins through one or more conductors (not shown). In some embodiments, such as those discussed in more detail below, source electrode fingers 242, 244, 246, and 248 are electrically connected to one another and to one or more pins through overlying metallization layers.

Drain electrode fingers 252, 254, 256, and 258 each form an ohmic contact with the underlying AlGaN or similar layer 224 on substrate 222 and collectively form the drain electrode of transistor 200. Drain electrode fingers 252, 254, 256, and 258 respectively form the drain electrodes of sub-transistors 202, 204, 206, and 208. The drain electrode fingers 252, 254, 256, and 258 are electrically connected to one another and to one or more pins through one or more conductors (not shown). In some embodiments, such as those discussed in more detail below, drain electrode fingers 252, 254, 256, and 258 are electrically connected to one another and to one or more pins through overlying metallization layers.

Gate electrode fingers 232, 234, 236, and 238 are separated from AlGaN or similar layer 224 by respective gate structures. Gate structures corresponding with insulated gates, Schottky gates, PN gates, recessed gates, and other gates may be used. Gate electrode fingers 232, 234, 236, and 238 collectively form the gate electrode of transistor 200, and respectively form the gates electrodes of sub-transistors 202, 204, 206, and 208. Gate electrode fingers 232, 234, 236, and 238 are electrically connected to one another and to one or more pins through one or more conductors (not shown). In some embodiments, such as those discussed in more detail below, gate electrode fingers 232, 234, 236, and 238 are electrically connected to one another and to one or more pins through overlying metallization layers.

Field plate electrode fingers 262, 264, 266, and 268 are separated from AlGaN or similar layer 224 by respective insulation structures, and collectively form a field plate electrode of transistor 200. Field plate electrode fingers 262, 264, 266, and 268 respectively form field plate electrodes of sub-transistors 202, 204, 206, and 208. Field plate electrode fingers 262, 264, 266, and 268 are electrically connected to one another and to one or more pins through one or more conductors (not shown). In some embodiments, such as those discussed in more detail below, field plate electrode fingers 262, 264, 266, and 268 are electrically connected to one another and to one or more pins through overlying metallization layers.

FIGS. 4A-4D are schematic illustrations of an embodiment of a particular one of the sub-transistors of FIGS. 3A and 3B having additional metallization. The additional metallization forms electrical connections between pins and the source electrode finger 248, drain electrode finger 258, gate electrode finger 238, and field plate electrode finger 268 of the underlying sub-transistor. The additional metallization layers may be particularly advantageous for circuits such as half bridge power conversion circuit 100. In some embodiments, the effective gate and/or source resistance of low side transistor 115 and high side transistor 125 may be reduced by use of additional metal layers connecting the gate and/or source fingers of low side transistor 115 and high side transistor 125. The reduced gate and/or source resistance results in, for example, faster switching times.

FIG. 4A is a cross sectional view of the one particular sub-transistor.

A first metal layer, overlying and separated from the sub-transistor by one or more insulators, is formed so as to have metal 1 structures 255, 245a, and 245b. Metal 1 structure 255 is electrically connected with drain electrode finger 258 through one or more vias (not shown). Metal 1 structure 245a is electrically connected with field plate electrode finger 268 through one or more vias (not shown). Metal 1 structure 245b is electrically connected with source electrode finger 248 through one or more vias (not shown). The first metal layer may, for example, be 0.5-2 microns thick and may comprise aluminum or copper. The first metal layer may comprise other metallic or non-metallic conductive materials.

A second metal layer, overlying and separated from the first metal layer and the sub-transistor by one or more insulators, is formed so as to have metal 2 structures 257, 247, and 237. Metal 2 structure 257 is electrically connected with metal 1 structure 255 through one or more vias (not shown). Metal 2 structure 247 is electrically connected with metal 1 structures 245*a* and 245*b* through one or more vias (not shown). Metal 2 structure 237 is electrically connected with gate electrode finger 238 as discussed below with reference to FIGS. 4B-4D. The second metal layer may, for example, be greater than 2 microns thick and may comprise aluminum or copper. The second metal layer may comprise other metallic or non-metallic conductive materials.

FIG. 4B is a plan view of source electrode finger 248, gate electrode finger 238, field plate electrode finger 268, and drain electrode finger 258. As shown, source electrode finger 248 is not continuous, and includes multiple segments separated by gaps. Each segment of source electrode finger 248 is electrically connected with metal 1 structure 245*b* through one or more vias (not shown). As shown, gate electrode finger 238 includes projection portions which extend into the gaps between the segments of source electrode finger 248.

FIG. 4C is a plan view of metal 1 structures 255, 245*a*, and 245*b*. As shown, metal 1 structure 245*b* includes openings 249, and metal 1 islands 243 within the openings 249. Openings 249 and metal 1 islands 243 are formed in the metal 1 structure 245*b* so as to overlap the projection portions of gate electrode finger 238 which extend into the gaps between the segments of source electrode finger 248. In addition, metal 1 islands 243 are electrically connected with the projection portions of gate electrode finger 238 by one or more vias (not shown).

FIG. 4D using plan view of metal 2 structures 257, 247, and 237. Metal 2 structure 237 is formed so as to overlap metal 1 structure 245*b*. In addition, metal 2 structure 237 is electrically connected with metal 1 islands 243 through one or more vias (not shown).

Accordingly, metal 2 structure 257 is electrically connected with drain electrode finger 258 of the sub-transistor through metal 1 structure 255. In addition, metal 2 structure 247 is electrically connected with plate electrode finger 268 and source electrode finger 248 through metal 1 structures 245*a* and 245*b*. Furthermore, metal 2 structure 237 is electrically connected with gate electrode finger 238 through the metal 1 islands 243 of metal 1 structure 245*b*.

Figure 5:
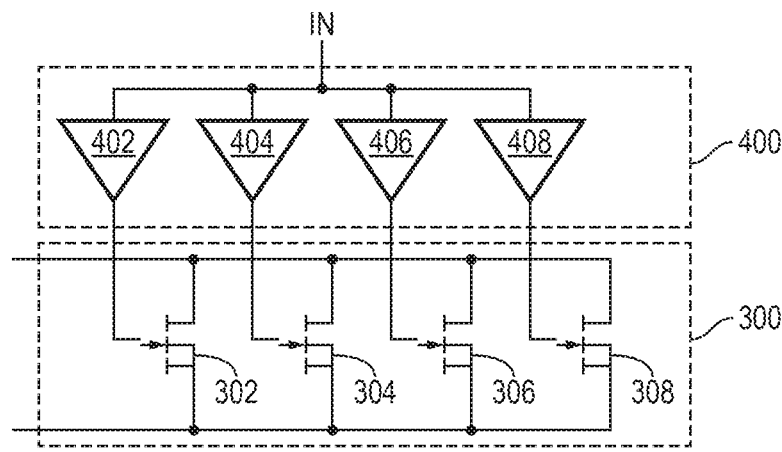
FIG. 5 is a schematic illustration of a distributed transistor having a distributed driver or driver output stage.

In some embodiments of integrated half bridge power conversion circuit 100, either or both of power transistors 115 and 125 and their respective driver 120 and 130 may be implemented with a distributed or fingered topology. For example, FIG. 5 is a schematic illustration of a distributed transistor 300 connected with a distributed driver or driver output stage 400.

Distributed driver or driver output stage 400 includes sub-drivers 402, 404, 406, and 408. Distributed transistor 300 may be similar to distributed transistor 200 of FIG. 2 and includes sub-transistors 302, 304, 306, and 308. As shown, sub-drivers 402, 404, 406, and 408 have inputs connected to the same signal IN. The outputs, however, of sub-drivers 402, 404, 406, and 408 are respectively connected with gate inputs of different sub-transistors 302, 304, 306, and 308. Because sub-drivers 402, 404, 406, and 408 have identical or substantially identical functionality, the outputs generated by sub-drivers 402, 404, 406, and 408 are identical or substantially identical.

In some embodiments, sub-transistors 302, 304, 306, and 308 have identical or substantially identical sizes. In such embodiments, sub-drivers 402, 404, 406, and 408 may likewise have identical or substantially identical sizes.

In some embodiments, sub-transistors 302, 304, 306, and 308 do not have identical sizes. In such embodiments, sub-drivers 402, 404, 406, and 408 may likewise not have identical sizes, but, instead, may have sizes which scale or correspond with the size of sub-transistors 302, 304, 306, and 308. For example, sub-driver 402 may have a size corresponding with or proportional to the size of sub-transistors 302, sub-driver 404 may have a size corresponding with or proportional to the size of sub-transistors 304, and sub-driver 406 may have a size corresponding or proportional to with the size of sub-transistors 306.

In some embodiments, each sub-driver of a distributed driver has an output which is connected to multiple sub-transistors. For example, each sub-driver of a distributed driver may have an output which is electrically connected to 2, 4, 8, or another number of sub-transistors. In such embodiments, the sub-transistors of the distributed power switch may be spaced according to a first pitch, and the sub-drivers of the distributed drive circuit are spaced according to a second pitch, and the second pitch is equal to n times the first pitch, wherein n is an integer.

Among other benefits, embodiments of integrated half bridge power conversion circuit 100 having power transistors and their respective drivers implemented with a distributed topology have superior timing performance. Because of the distributed topology, each segment of the power transistor is turned on or off at substantially the same time. Without the distributed technology, the time at which each particular portion of the power transistor is turned on or off is dependent on the propagation delay and arrival time of the controlling signal at each particular portion.

Figure 6:
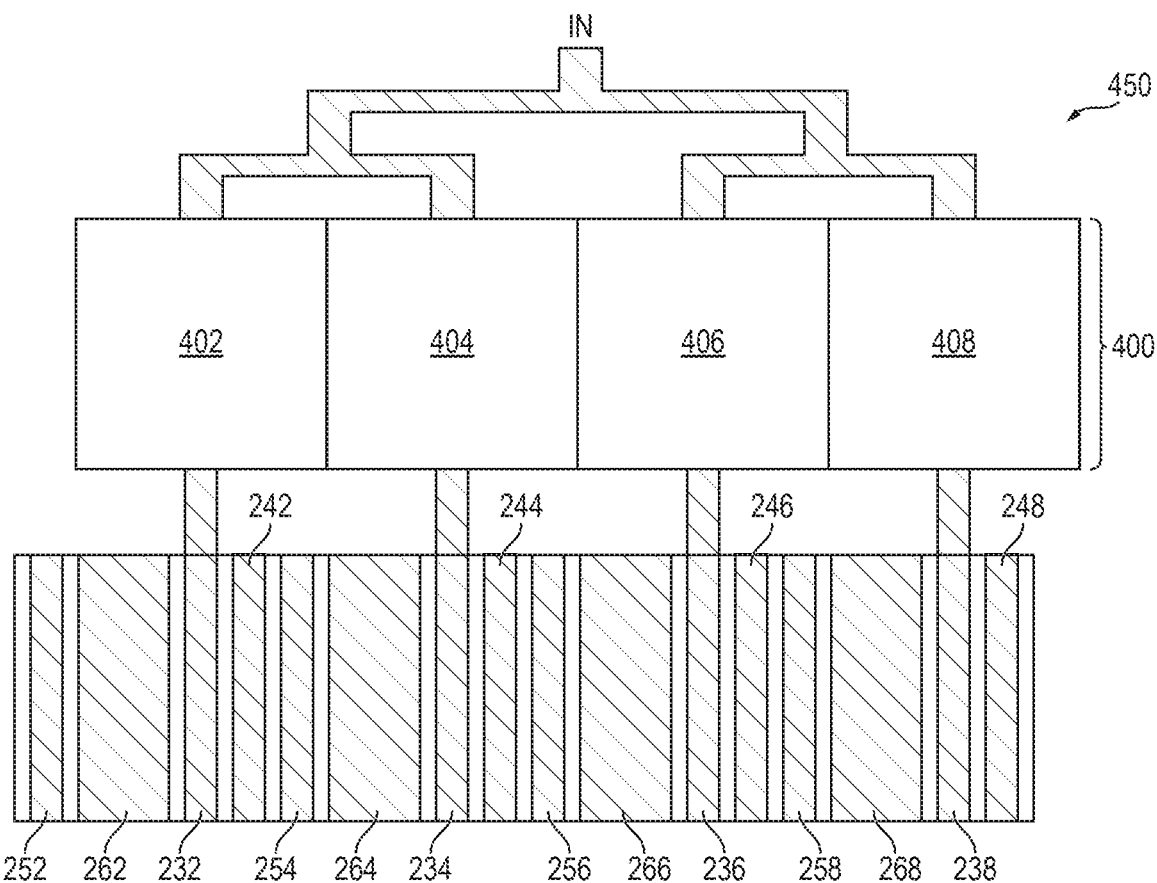
FIG. 6 is a schematic illustration of portion of an embodiment of a layout of a distributed transistor and distributed driver or driver output stage.

FIG. 6 is a schematic illustration of portion 450 of an embodiment of a layout of transistor 300 and driver or driver output stage 400. The embodiment of FIG. 6 is provided as an example only. Numerous alternative layout configurations for transistor 300 are additionally contemplated. To details of the layout of driver or driver output stage 400 is not illustrated, as the inventive aspects apply equally to any driver or driver output stage.

As shown, sub-drivers 402, 404, 406, and 408 are each connected to the input signal IN with a conductor of identical length and impedance. In addition, sub-drivers 402, 404, 406, and 408 are respectively connected gate electrodes of sub-transistors 302, 304, 306, and 308 with a conductor of identical length and impedance.

Figure 7:
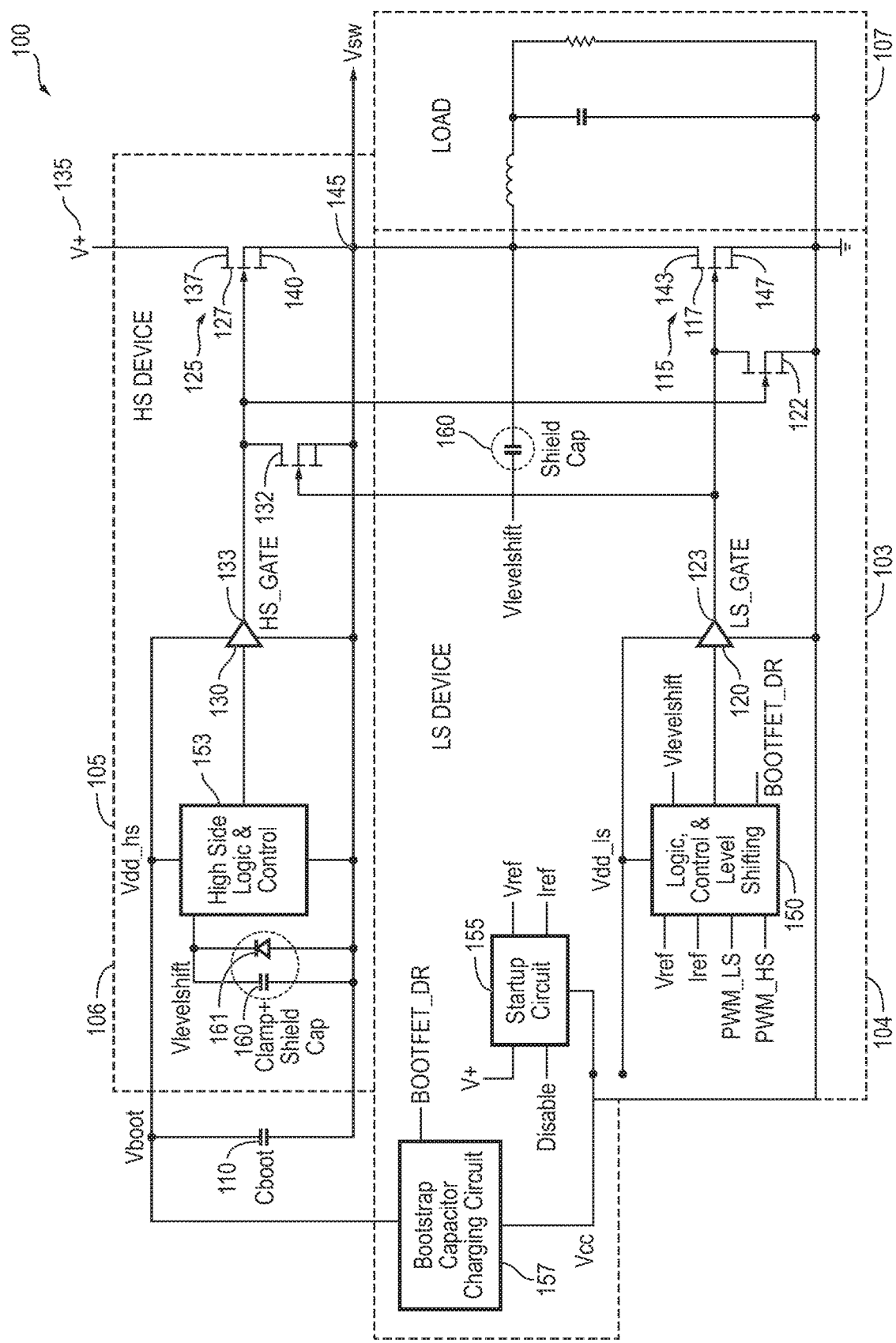
FIG. 7 is a simplified schematic of a half bridge power conversion circuit having been modified to include a low side pulldown FET and a high side pulldown FET.

FIG. 7 is a simplified schematic of half bridge power conversion circuit 100 having been modified to include low side pulldown FET 122 and high side pulldown FET 132. In some half bridge power conversion circuits, parasitic inductances and capacitances result in transient voltages at the gate of low side transistor 115 and at the gate of high side transistor 125. Low side pulldown FET 122 is configured to be on when low side transistor 115 is off, such that the transient voltages at the gate of low side transistor 115 remain low enough that low side transistor 115 is not turned on as a result of the transient voltages. Similarly, high side pulldown FET 132 is configured to be on when high side transistor 125 is off, such that the transient voltages at the gate of high side transistor 125 remain low enough that high side transistor 125 is not turned on as a result of the transient voltages.

In some embodiments, the low side pulldown FET 122 and high side pulldown 132 advantageously help to reduce the voltages at the gates of low side transistor 115 and high side transistor 125, such that low side transistor 115 and high side transistor 125 are turned off quickly, thus allowing for higher frequency operation.

Figure 8:
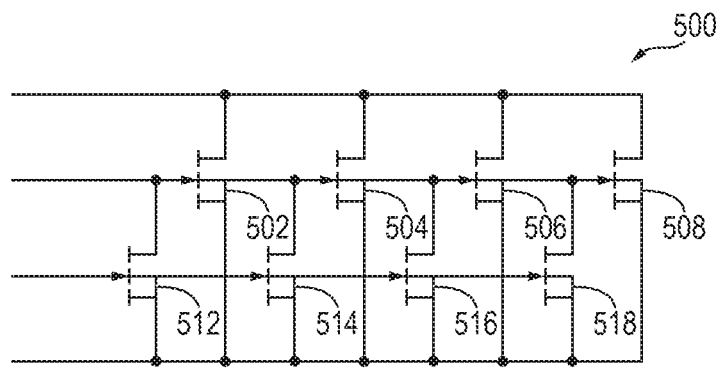
FIG. 8 is a schematic illustration of a circuit having a distributed transistor and a distributed pulldown FET.

FIG. 8 is a schematic illustration of a circuit 500 having a distributed transistor and a distributed pulldown FET. The distributed transistor of circuit 500 includes sub-transistors 502, 504, 506, and 508. The distributed pulldown FET of circuit 500 includes sub-FETs 512, 514, 516, and 518. As shown, the gate of each sub-transistor is connected to the drain of a corresponding sub-FET.

Figure 9:
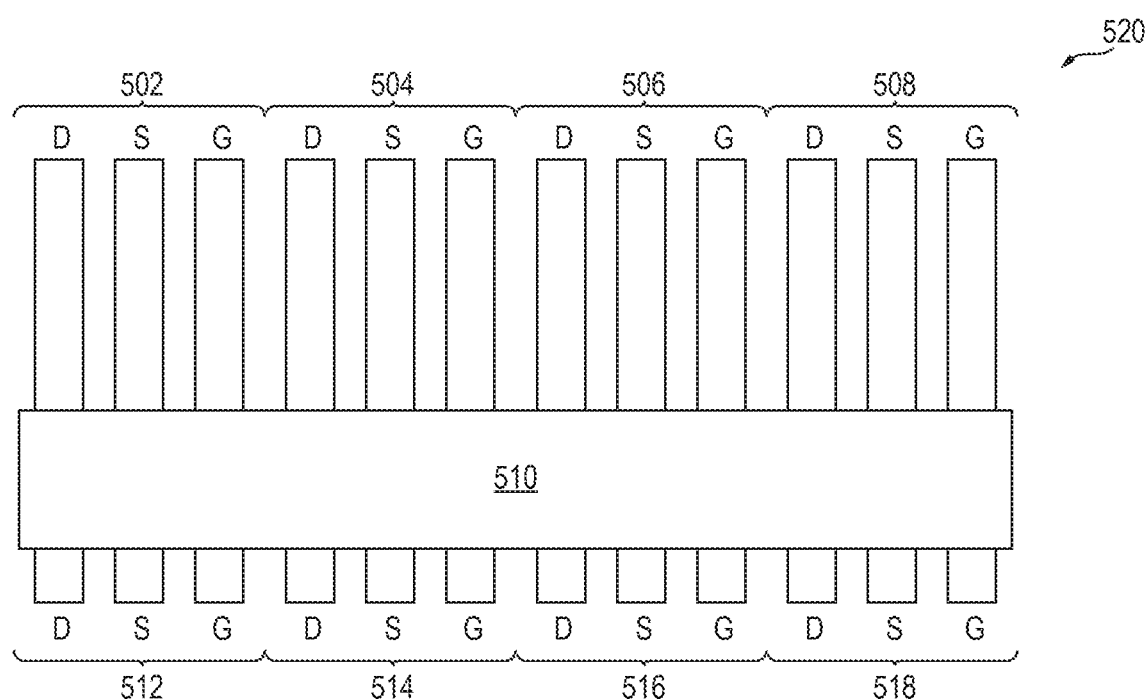
FIG. 9 a schematic illustration of an embodiment of a layout of the circuit of FIG. 8.

FIG. 9 a schematic illustration of an embodiment of a layout 520 of circuit 500. The embodiment of FIG. 9 is provided as an example only. Numerous alternative layout configurations for circuit 500 are additionally contemplated.

The layout 520 illustrates the metal 2 drain D, source S, and gate G structures of circuit 500. The illustrated metal 2 drain D, source S, and gate G structures respectively correspond, for example, with metal 2 structures 257, 247, and 237 discussed above with reference to FIGS. 4A-4D.

The layout 520 also illustrates interconnect structure 510. Interconnect structure 510 includes, for example, a metal 1 layer, a metal 2 layer, and vias connecting portions of the metal 1 layer with portions of the metal 2 layer. Interconnect structure 510 is configured to electrically connect metal 2 drain D structures of sub-transistors 512, 514, 516, and 518 with metal 2 gate G structures of sub-transistors 502, 504, 506, and 508, respectively. In addition, interconnect structure 500 is configured to electrically connect metal 2 source S structures of sub-transistors 512, 514, 516, and 518 with metal 2 source S structures of sub-transistors 502, 504, 506, and 508, respectively.

In some embodiments, the orientation of sub-transistors 502, 504, 506, and 508 is reversed with respect to the orientation of sub-transistors 512, 514, 516, and 518. In such embodiments, interconnect structure 510 may comprise metal 2 jumpers configured to respectively make the appropriate connections between sub-transistors 502, 504, 506, and 508 and sub-transistors 512, 514, 516, and 518.

Figure 10:
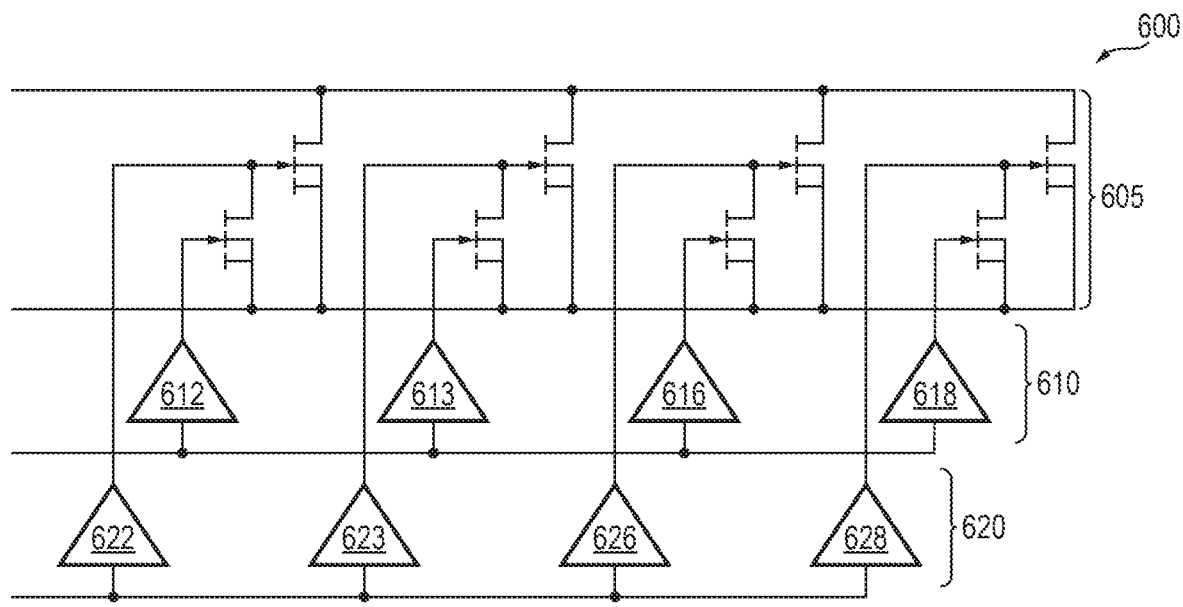
FIG. 10 is a schematic illustration of a circuit having a distributed transistor and pulldown FET, a distributed pulldown FET driver, and a distributed transistor driver.

FIG. 10 is a schematic illustration of a circuit 600 having a distributed transistor and pulldown FET 605, a distributed pulldown FET driver 610, and a distributed transistor driver 620. The distributed transistor and pulldown FET 605 of circuit 600 may be similar to circuit 500 of FIG. 8.

The distributed pulldown FET driver 610 includes sub-drivers 612, 614, 616, and 618. The distributed transistor driver 620 includes sub-drivers 622, 624, 626, and 628. As shown, the gate of each sub-transistor of the distributed transistor is connected to the output of a corresponding sub-driver of the distributed transistor driver 620. Additionally, the gate of each sub-FET of the distributed pulldown FET is connected to the output of a corresponding sub-driver of the distributed pulldown FET driver 610.

In some embodiments of half bridge power conversion circuit 100, the distributed transistor and pulldown FET 605 of circuit 600 corresponds with low side transistor 115 and low side pulldown FET 122. In such embodiments, distributed transistor driver 620 corresponds with low side transistor drive circuit 120, and distributed pulldown FET driver 610 corresponds with high side transistor drive circuit 130, as illustrated, for example, in FIG. 7.

In some embodiments of half bridge power conversion circuit 100, the distributed transistor and pulldown FET 605 of circuit 600 corresponds with high side transistor 125 and high side pulldown FET 132. In such embodiments, distributed transistor driver 620 corresponds with high side transistor drive circuit 130, and distributed pulldown FET driver 610 corresponds with low side transistor drive circuit 120, as illustrated, for example, in FIG. 7.

In some embodiments of half bridge power conversion circuit 100, the gates of low side pulldown FET 122 and high side pulldown FET 132 are respectively driven by inverter circuits having their inputs respectively driven by low side transistor drive circuit 120 and high side transistor drive circuit 130.

Figure 11:
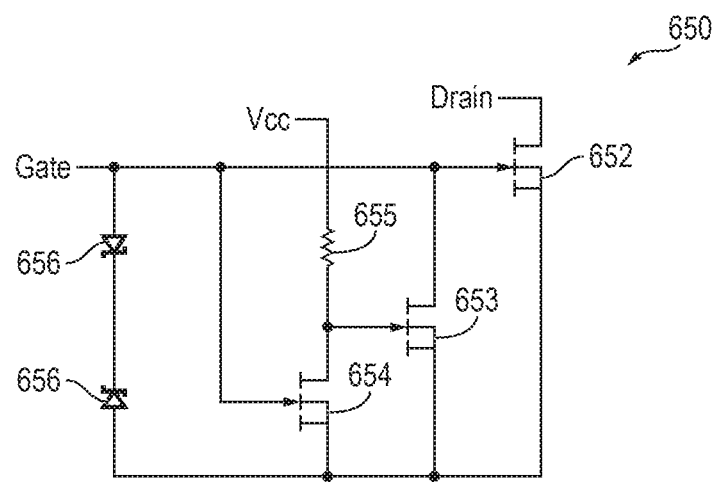
FIG. 11 is a schematic illustration of a circuit, which includes a drive transistor, a pulldown FET, and an inverter.

FIG. 11 is a schematic illustration of a circuit 650, which includes drive transistor 652, pulldown FET 653, and an inverter comprising transistor 654 and resistor 655. Circuit 650 also includes optional Zener diodes 656, which may provide overvoltage and/or ESD protection.

In some embodiments of half bridge power conversion circuit 100 as shown in FIG. 1, an instance of circuit 650 may be used instead of each of low side transistor 115 and high side transistor 125.

As shown in FIG. 11, the Gate input signal is provided both to the gate of drive transistor 652 and to the gate of transistor 654 of the inverter. The output of the inverter is connected to the gate of pulldown FET 653. Accordingly, if the drive transistor 652 is on as a result of sufficient voltage at the Gate input, the output of the inverter turns off the pulldown FET 653 to allow for the drive transistor 652 to be on. Similarly, if the drive transistor 652 is off as a result of insufficient voltage at the Gate input, the output of the inverter turns on the pulldown FET 653 to reduce the gate to source impedance of the drive transistor 652. As a result of the pulldown FET 653 being on, transient voltages at the Gate input are minimized by pulldown FET 653 to be sufficiently low that the drive transistor 652 does not unwantedly turn on as a result of the transient voltages.

Figure 12:
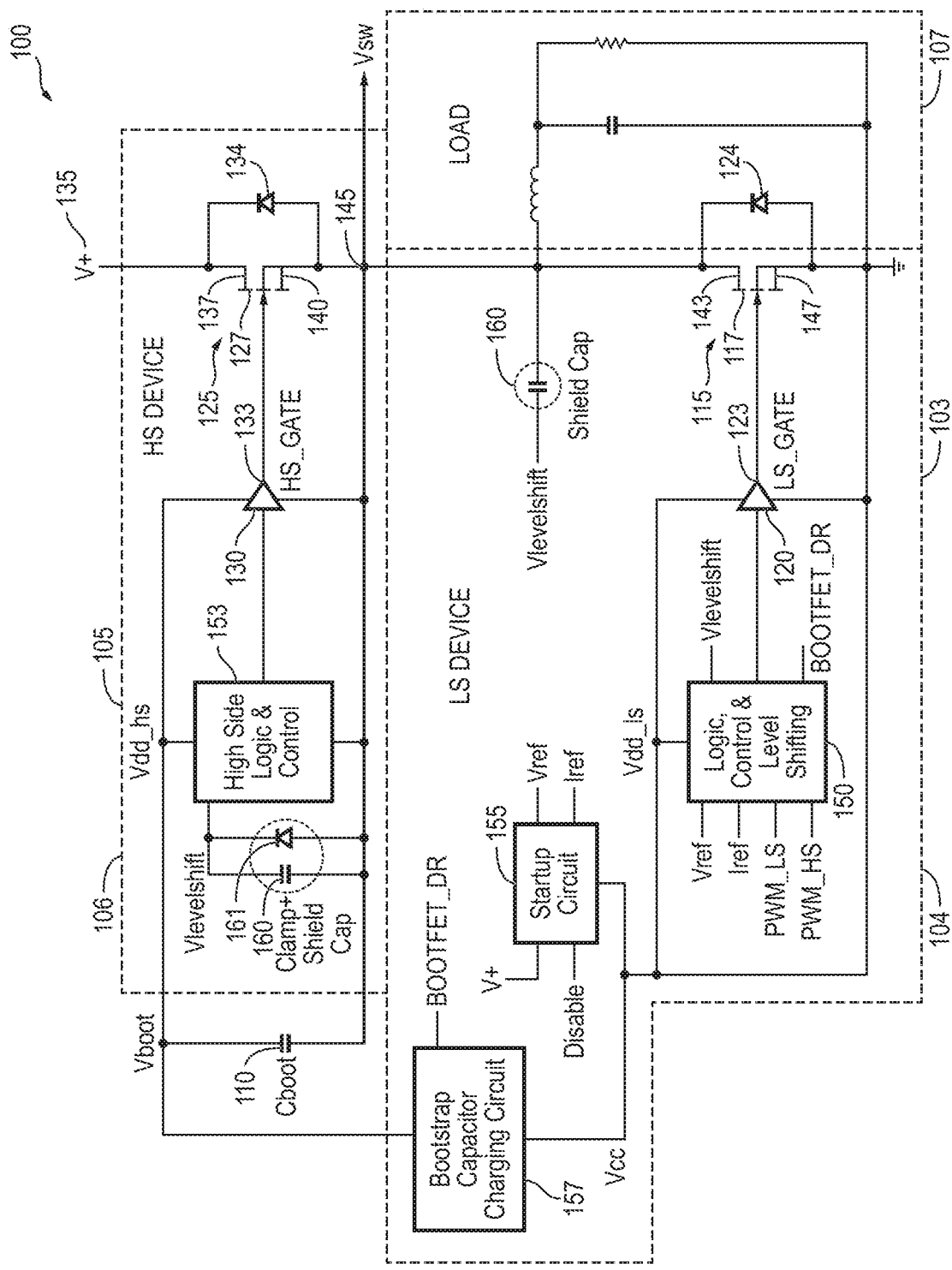
FIG. 12 is a simplified schematic of a half bridge power conversion circuit having been modified to include clamping diodes.

FIG. 12 is a simplified schematic of half bridge power conversion circuit 100 having been modified to include diodes 124 and 134. In 124 and 134 have anodes respectively connected to the sources of low side transistor 115 and high side transistor 125. In addition, 124 and 134 have cathodes respectively connected to the drains of low side transistor 115 and high side transistor 125. Diodes 124 and 134 are respectively configured to conduct current from the sources of low side transistor 115 and high side transistor 125 to the drains of low side transistor 115 and high side transistor 125 if, for example, an inductive load causes current to flow in the opposite direction.

Without diode 124, the inductive load may cause the voltage at the node Vsw to go significantly below ground before low side transistor 115 turns on. Once on, low side transistor 115 clamps the voltage at the node Vsw to a voltage about equal to a transistor threshold below ground. Similarly, without diode 134, the inductive load may cause the voltage at the node Vsw to go significantly above V+ before high side transistor 125 turns on. Once on, high side transistor 125 clamps the voltage at the node Vsw to a voltage about equal to a transistor threshold above V+.

In contrast, with diodes 124 and 134 the voltage at the node Vsw is clamped to a diode threshold below ground and a diode threshold above V+. With diodes 124 and 134, current flows earlier or at less extreme voltages. To turn on diode 124, the voltage induced by the inductive load at the node Vsw must go lower than a diode threshold below ground. Similarly, to turn on diode 134, the voltage induced by the inductive load at the node Vsw must go above a diode threshold above V+. Because the diode threshold of diodes 124 and 134 is less than the transistor threshold voltages of low side transistor 115 and high side transistor 125, with diodes 124 and 134, the voltage at the node Vsw is clamped to a more preferable smaller range.

In some embodiments, diodes 124 and 134 may be distributed, for example, as part of a distributed implementation of low side transistor 115 or high side transistor 125, for example, as discussed below in further detail.

Figure 13:
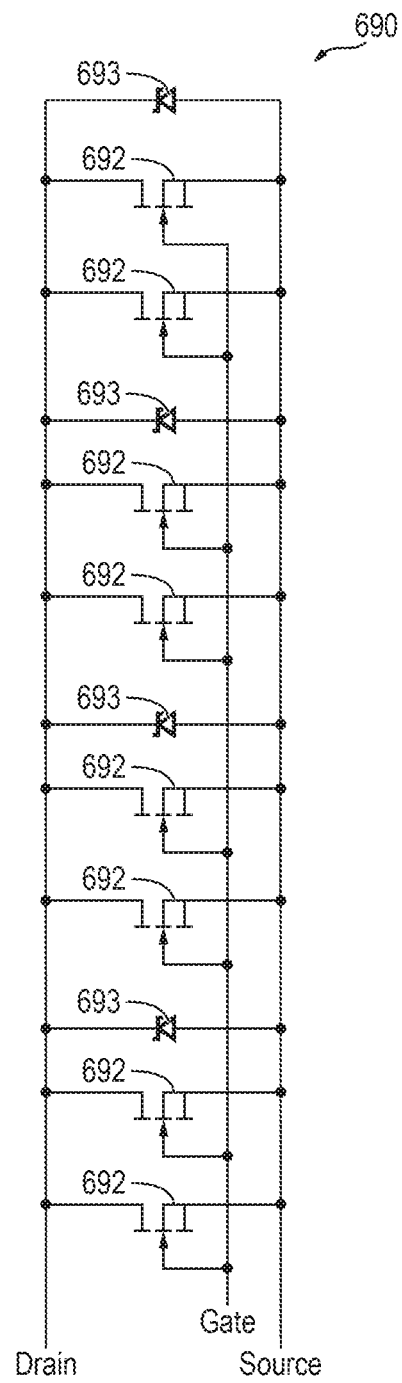
FIG. 13 is a schematic illustration of a circuit having a distributed transistor and a distributed diode.

FIG. 13 is a schematic illustration of a circuit 690 having a distributed transistor and a distributed diode. The distributed diode has its anode connected to the source of the distributed transistor and its cathode connected to the drain of the distributed transistor. The distributed transistor includes sub-transistors 692, and the distributed diode includes sub-diodes 693. In this embodiment, there is one sub-diode for every two sub-transistors. In other embodiments, there is one sub-diode for every fewer or more sub-transistors.

Figure 14:
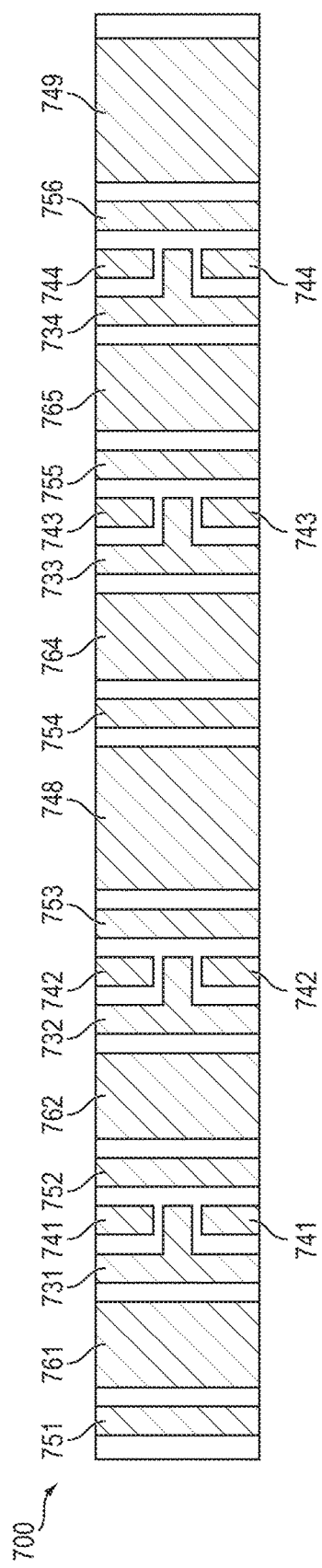
FIG. 14 is a schematic illustration of a portion of an embodiment of the circuit of FIG. 13.

FIG. 14 is a schematic illustration of a portion 700 of an embodiment of a layout of circuit 690. The embodiment of FIG. 14 is provided as an example only. Numerous alternative layout configurations for circuit 690 are additionally contemplated.

Source electrode fingers 741, 742, 743, and 744 each form an ohmic contact with an underlying AlGaN or similar layer and collectively form the source electrode of the distributed transistor of circuit 690. Source electrode fingers 741, 742, 743, and 744 respectively form the source electrodes of sub-transistors 692. The source electrode fingers 741, 742, 743, and 744 are electrically connected to one another and to one or more pins through one or more conductors (not shown). In some embodiments, source electrode fingers 743, and 744 are electrically connected to one another and to one or more pins through overlying metallization layers.

Drain electrode fingers 751, 752, 753, 754, 755, and 756 each form an ohmic contact with the underlying AlGaN or similar layer and collectively form the drain electrode of the distributed transistor of circuit 690. Drain electrode fingers 751, 752, 753, 754, 755, and 756 respectively form the drain electrodes of sub-transistors 692. The drain electrode fingers 751, 752, 753, 754, 755, and 756 are electrically connected to one another and to one or more pins through one or more conductors (not shown). In some embodiments, drain electrode fingers 751, 752, 753, 754, 755, and 756 are electrically connected to one another and to one or more pins through overlying metallization layers.

Gate electrode fingers 731, 732, 733, and 734 are separated from the AlGaN or similar layer by respective gate structures. Gate structures corresponding with insulated gates, Schottky gates, PN gates, recessed gates, and other gates may be used. Gate electrode fingers 731, 732, 733, and 734 collectively form the gate electrode of the distributed transistor of circuit 690, and respectively form the gates electrodes of sub-transistors 692. Gate electrode fingers 731, 732, 733, and 734 are electrically connected to one another and to one or more pins through one or more conductors (not shown). In some embodiments, gate electrode fingers, 731, 732, 733, and 734 are electrically connected to one another and to one or more pins through overlying metallization layers.

Field plate electrode fingers 761, 762, 764, and 765 are separated from the AlGaN or similar layer by respective insulation structures, and collectively form a field plate electrode of the distributed transistor of circuit 690. Field plate electrode fingers 761, 762, 764, and 765 respectively form field plate electrodes of sub-transistors 692. Field plate electrode fingers 761, 762, 764, and 765 are electrically connected to one another and to one or more pins through one or more conductors (not shown). In some embodiments, field plate electrode fingers 761, 762, 764, and 765 are electrically connected to one another and to one or more pins through overlying metallization layers.

Diode electrode fingers 748 and 749 form diodes 693 of circuit 690.

Figure 15:
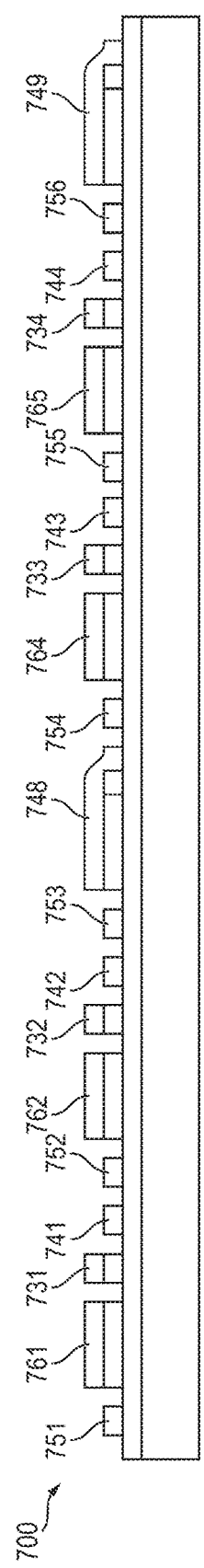
FIG. 15 a schematic illustration of a cross section of the portion illustrated in FIG. 14.

FIG. 15 a schematic illustration of a cross section of portion 700 taken along the top or bottom edge of FIG. 14. Source electrode fingers 741, 742, 743, and 744, drain electrode fingers 751, 752, 753, 754, 755, and 756, gate electrode fingers 731, 732, 733, and 734, and field plate electrode fingers 761, 762, 764, and 765 are similar to the corresponding structures of, for example, transistor 200, as illustrated in FIG. 3B.

In this embodiment, every third sub-transistor functions as a sub-diode of the distributed diode because its gate is connected to its source. As shown in FIG. 15, diode electrode fingers 748 and 749 contact the AlGaN or similar layer and overly the gate structure, thereby forming gate to source connections. In this embodiment, diode electrode fingers 748 and 749 also form the filed plates of the diode connected sub-transistors.

In alternative embodiments, diode connected sub-transistors have cross-sectional architecture which is identical to that of transistor 200, as illustrated in FIG. 3B. in such embodiments, Gates and sources of the sub-transistors are connected, for example, in the additional metallization overlying the sub-transistors.

Figure 16:
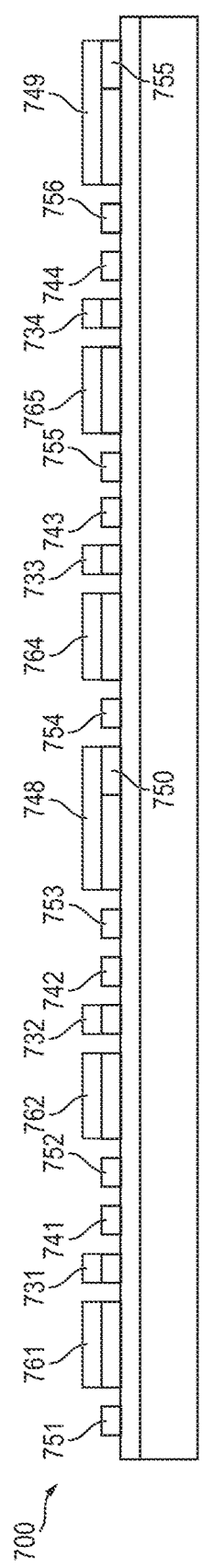
FIG. 16 a schematic illustration of a cross section of the portion illustrated in FIG. 14.

FIG. 16 a schematic illustration of a cross section of portion 700 taken along the top or bottom edge of FIG. 14. Source electrode fingers 741, 742, 743, and 744, drain electrode fingers 751, 752, 753, 754, 755, and 756, gate electrode fingers 731, 732, 733, and 734, and field plate electrode fingers 761, 762, 764, and 765 are similar to the corresponding structures of, for example, transistor 200, as illustrated in FIG. 3B.

In this embodiment, the gate structure of every third sub-transistor is omitted. In place of the omitted gate structures, Schottky barriers are respectively formed at the junctions of the AlGaN or similar layer and Schottky structures 750 and 755 beneath diode electrode fingers 748 and 749. Schottky structures comprise a Schottky metal. In some embodiments, diode electrode fingers 748 and 749 comprise a Schottky metal and are respectively integrated with Schottky structures 750 and 755.

Figure 17:
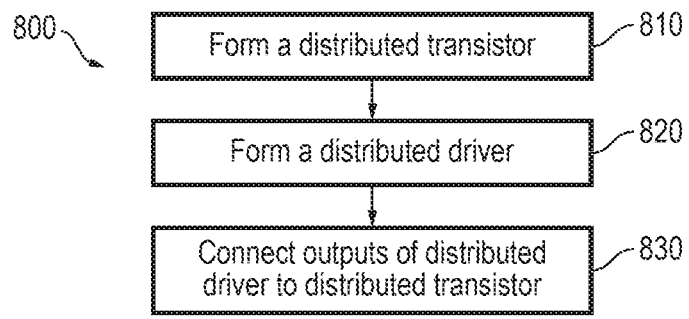
FIG. 17 is a flowchart diagram illustrating an embodiment of a method of forming a distributed transistor integrated with a distributed driver.

FIG. 17 is a flowchart diagram illustrating an embodiment of a method 800 of forming a distributed transistor integrated with a distributed driver.

At 810, a distributed transistor is formed. For example, a transistor having fingered gates and fingered sources may be formed by forming multiple adjacent sub-transistors each including a source and a gate. In some embodiments, the sources of the sub-transistors are electrically connected with a conductor. In some embodiments, the gates of the sub-transistors are electrically connected with a conductor. In some embodiments, the sub-transistors share a collective drain connection. In some embodiments, the sub transistors each have a separate drain connection.

At 820, a distributed driver is formed. The distributed driver includes at least an output stage which is distributed. For example, the output stage of the driver may include a distributed pull up transistor and a distributed pulldown transistor, where the distributed pull up transistor includes multiple pull up sub-transistors and the distributed pulldown transistor includes multiple pull down sub-transistors. In some embodiments, other or all portions of the distributed driver or also distributed.

In some embodiments, the distributed pull up transistor and the distributed pulldown transistor are formed using a process similar to that described at 810. In some embodiments, sources of the pull up sub-transistors are each connected with a drain of a corresponding one of the pulldown sub-transistors with a conductor. Each pair of corresponding pull up and pulldown sub-transistors forms a sub-driver having an output electrode formed by the conductor connecting the source of the pull up sub-transistor and the drain of the pulldown sub-transistor thereof.

In some embodiments, the distributed pull up transistor, the distributed pulldown transistor, and the distributed transistor of 810 are formed having the same pitch. In such embodiments, each sub-transistor of the distributed transistor of 810 may be aligned with a pair of corresponding pull up and pulldown sub-transistors forming a sub-driver.

At 830, the outputs of the distributed driver are connected to the fingered gates of the distributed transistor. For example, the gates of the sub-transistors of the distributed transistor may each be connected to an output electrode of a corresponding sub-driver with a conductor. In some embodiments, the conductor connecting the gates of the sub-transistors to the output electrodes of the sub-drivers is the same conductor as that connecting the sources of the pull up sub-transistors with the drains of the pulldown sub-transistors of the sub-drivers.

Figure 18:
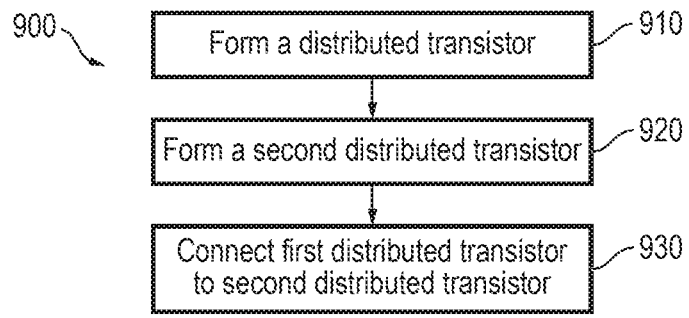
FIG. 18 is a flowchart diagram illustrating an embodiment of a method of forming first and second distributed transistors.

FIG. 18 is a flowchart diagram illustrating an embodiment of a method 900 of forming first and second distributed transistors.

At 910, a first distributed transistor is formed. For example, a first transistor having fingered gates and fingered sources may be formed by forming multiple adjacent sub-transistors each including a source and a gate. In some embodiments, the sources of the sub-transistors are electrically connected with a conductor. In some embodiments, the gates of the sub-transistors are electrically connected with a conductor. In some embodiments, the sub-transistors share a collective drain connection. In some embodiments, the sub transistors each have a separate drain connection.

At 920, a second distributed transistor is formed. For example, a second transistor having fingered gates and fingered sources may be formed by forming multiple adjacent sub-transistors each including a source and a gate. In some embodiments, the sources of the sub-transistors are electrically connected with a conductor. In some embodiments, the gates of the sub-transistors are electrically connected with a conductor. In some embodiments, the sub-transistors share a collective drain connection. In some embodiments, the sub transistors each have a separate drain connection.

In some embodiments, the first distributed transistor and the second distributed transistor are formed having the same pitch. In such embodiments, each sub-transistor of the first distributed transistor may be aligned with one of the sub-transistors of the second distributed transistor.

At 930, the first distributed transistor is connected to the second distributed transistor. For example, if the gates of the sub-transistors of the first distributed transistor may be connected by a first conductor with a collective drain of the second distributed transistor. In addition, the sources of each of the sub-transistors of the first distributed transistor may be connected by a second conductor with the sources of the sub-transistors of the second distributed transistor.

In some embodiments, the first distributed transistor may be formed with a first driver using a method such as method 800 described above. In some embodiments, the second distributed transistor be formed with a second driver using a method such as method 800 describe above.

Figure 19:
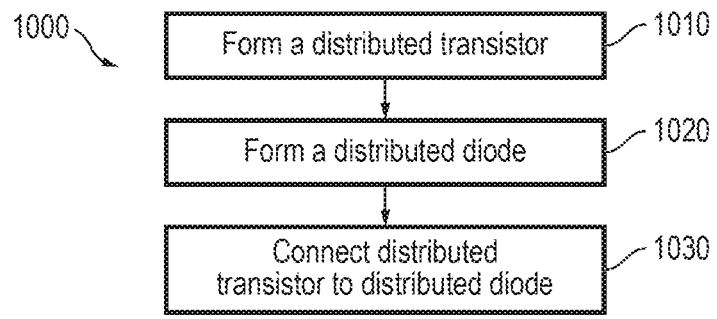
FIG. 19 is a flowchart diagram illustrating an embodiment of a method of forming first and second distributed transistors.

FIG. 19 is a flowchart diagram illustrating an embodiment of a method 1000 of forming a distributed transistor and a distributed diode.

At 1010, a distributed transistor is formed. For example, a transistor having fingered gates and fingered sources may be formed by forming multiple sub-transistors each including a source and a gate. In some embodiments, the sources of the sub-transistors are electrically connected with a conductor. In some embodiments, the gates of the sub-transistors are electrically connected with a conductor. In some embodiments, the sub-transistors share a collective drain connection. In some embodiments, the sub transistors each have a separate drain connection.

At 1020, a distributed diode is formed. For example, a fingered diode may be formed such that the fingers of the fingered diode are interleaved with the fingered gates and sources of the sub-transistors of the distributed transistor. In some embodiments, the distributed diode is formed by electrically connecting gates and sources of some of the sub-transistors of the distributed transistor. In some embodiments, the distributed diode is formed by connecting a Schottky metal to the drain of the distributed transistor in multiple locations.

At 1030, the distributed transistor is connected to the distributed diode. For example, the anodes of the sub-diodes may be connected with the sources of each of one or more sub-transistors of the distributed transistor, and the cathodes of the sub-diodes may be connected with the drain of the distributed transistor.

In some embodiments, the anodes of the sub-diodes are connected with the sources of each of one or more sub-transistors of the distributed transistor by electrically connecting the gates and sources of some of the sub-transistors of the distributed transistor. In some embodiments, the anodes of the sub-diodes are connected with the sources of each of one or more sub-transistors on the distributed transistor by electrically connecting the Schottky metal/drain junctions of the distributed diode to the sources of each of one or more sub-transistors of the distributed transistor.

In some embodiments, the distributed transistor may be formed with a driver using a method such as method 800 described above. In some embodiments, the distributed transistor and the distributed diode may be formed with a driver using a method such as method 800 described above. In some embodiments, the distributed transistor may be formed with a second distributed transistor using a method such as method 900 described above.

Figure 20:
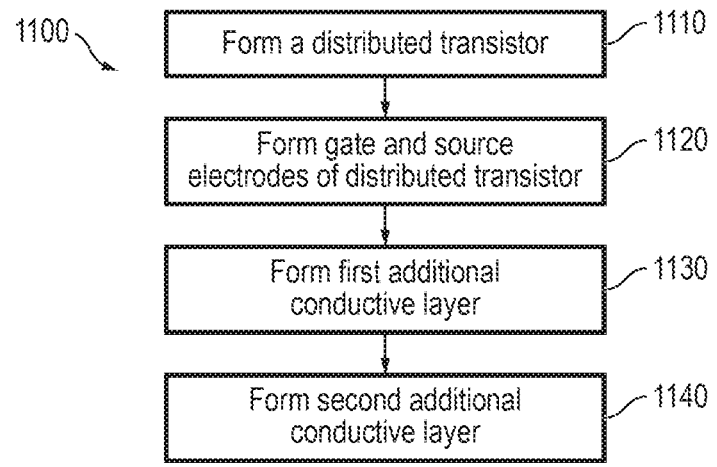
FIG. 20 is a flowchart diagram illustrating an embodiment of a method of forming a distributed transistor.

FIG. 20 is a flowchart diagram illustrating an embodiment of a method 1100 of forming a distributed transistor.

At 1110, a distributed transistor is formed. For example, a transistor having fingered gates and fingered sources may be formed by forming multiple sub-transistors each including a source and a gate.

At 1120, ohmic contacts to the gates and sources of the sub-transistors are formed by respectively contacting the gates and sources of the sub-transistors with ohmic gate and source conductors. In some embodiments, the gates of the sub-transistors are electrically connected to one another with a conductor. In some embodiments, the sources of the sub-transistors are electrically connected to one another with a conductor. In some embodiments, the sub-transistors share a collective drain connection. In some embodiments, the sub-transistors each have a separate drain connection.

At 1130, a first additional conductive layer is formed. In some embodiments, the first additional conductive layer at least partially covers and electrically contacts the ohmic contact of the gates of the sub-transistors through one or more vias. In some embodiments, the first additional conductive layer at least partially covers and electrically contacts the ohmic contact of the sources of the sub-transistors through one or more vias.

At 1140, a second additional conductive layer is formed. In some embodiments, the second additional conductive layer at least partially covers and electrically contacts the ohmic contact of the gates of the sub-transistors through one or more vias and through an opening in the first additional conductive layer. In some embodiments, the second additional conductive layer at least partially covers and electrically contacts the ohmic contact of the gates of the sub-transistors through one or more vias and through an opening in the first additional conductive layer.

In some embodiments, the ohmic gate conductor overlaps the sources of the sub-transistors. In some embodiments, the second additional conductive layer electrically contacts the ohmic contact of the gates of the sub-transistors and a portion of the ohmic conductor which overlaps the sources of the sub-transistors.

In some embodiments, the distributed transistor may be formed with a driver using a method such as method 800 described above. In some embodiments, the distributed transistor may be formed with a second distributed transistor using a method such as method 900 described above.

Each of the circuits discussed herein include one or more inventive features. The various features of the circuits may be applied to other embodiments of circuits in combinations of features which are contemplated, but not specifically discussed for the sake of brevity.

The various aspects of the devices discussed herein may be practiced in other semiconductor technologies. For example, the various aspects of the devices discussed herein may be practiced in Silicon, Germanium, Gallium Arsenide, Silicon Carbide, Organic, and other technologies.

While various embodiments of present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. An electronic circuit, comprising:
    a substrate comprising GaN;
    a distributed GaN power switch formed on the substrate and including a plurality of power sub-transistors that each comprise a respective first gate, a respective first source, and a respective first drain;
        wherein each respective first gate of each of the plurality of power sub-transistors is electrically connected to the respective first gate of each of the other power sub-transistors of the plurality of power sub-transistors at a common power gate node;
        wherein each respective first source of each of the plurality of power sub-transistors is electrically connected to the respective first source of each of the other power sub-transistors of the plurality of power sub-transistors at a common power source node; and
        wherein each respective first drain of each of the plurality of power sub-transistors is electrically connected to the respective first drain of each of the other power sub-transistors of the plurality of power sub-transistors at a common power drain node; and
    a distributed GaN pull-down switch formed on the substrate and including a plurality of pull-down sub-transistors that each comprise a respective second gate, a respective second source, and a respective second drain;
        wherein each respective second gate of each of the plurality of pull-down sub-transistors is electrically connected to the respective second gate of each of the other pull-down sub-transistors of the plurality of pull-down sub-transistors at a common pull-down gate node;
        wherein each respective second source of each of the plurality of pull-down sub-transistors is electrically connected to the respective second source of each of the other pull-down sub-transistors of the plurality of pull-down sub-transistors at a common pull-down source node; and
        wherein each respective second drain of each of the plurality of pull-down sub-transistors is electrically connected to the respective second drain of each of the other pull-down sub-transistors of the plurality of pull-down sub-transistors at the common power gate node;
    wherein each pull-down sub-transistor of the plurality of pull-down sub-transistors is physically adjacent a respective one of the power sub-transistors of the plurality of power sub-transistors;
    wherein each respective second gate of each of the plurality of pull-down sub-transistors is electrically connected to a first driver circuit that controls operation of the distributed GaN pull-down switch between an on state and an off state, wherein when in the on state the distributed GaN pull-down switch couples the power gate node to the pull-down source node causing the distributed GaN power switch to be in an off state such that the power drain node is electrically isolated from the power source node;
    wherein each respective first gate of each of the plurality of power sub-transistors is electrically connected to a second driver circuit that controls operation of the distributed GaN power switch between an on state and an off state, wherein when in the on state the power drain node is connected to the power source node and when in the off state the power drain node is electrically isolated from the power source node.

2. The electronic circuit of claim 1, wherein each power sub-transistor of the plurality of power sub-transistors is physically adjacent a respective one of the pull-down sub-transistors of the plurality of pull-down sub-transistors.

3. The electronic circuit of claim 1, further comprising an interconnect structure between the plurality of power sub-transistors and the plurality of pull-down sub-transistors, wherein the interconnect structure is configured to electrically connect each respective first gate of each of the plurality of power sub-transistors to other respective first gates of the other power sub-transistors.

4. The electronic circuit of claim 1, further comprising an interconnect structure between the plurality of power sub-transistors and the plurality of pull-down sub-transistors, wherein the interconnect structure is configured to electrically connect each respective first gate of each of the plurality of power sub-transistors to each respective second drain of each of the pull-down sub-transistors of the plurality of pull-down sub-transistors.

5. The electronic circuit of claim 1, further comprising an interconnect structure between the plurality of power sub-transistors and the plurality of pull-down sub-transistors, wherein the interconnect structure is configured to electrically connect each respective first source of each of the plurality of power sub-transistors to each respective second source of each of the pull-down sub-transistors of the plurality of pull-down sub-transistors.

6. The electronic circuit of claim 1, wherein each of the plurality of power sub-transistors has an identical orientation as the other each of the plurality of power sub-transistors with respect to the substrate.

7. The electronic circuit of claim 1, wherein each of the plurality of pull-down sub-transistors has an identical orientation as the other each of the plurality of pull-down sub-transistors with respect to the substrate.

8. The electronic circuit of claim 1, further comprising:
a GaN power switch formed on the substrate, wherein a source terminal of the GaN power switch is connected to the common power drain node of the distributed GaN power switch; and
a GaN pull-down switch formed on the substrate.

9. An electronic circuit, comprising:
a substrate comprising GaN;
a first distributed GaN power switch formed on the substrate and including a plurality of first power sub-transistors that each comprise a respective first gate, a respective first source, and a respective first drain;
    wherein each respective first gate of each of the plurality of first power sub-transistors is electrically connected to the respective first gate of each of the other first power sub-transistors of the plurality of first power sub-transistors at a common first power gate node;
    wherein each respective first source of each of the plurality of first power sub-transistors is electrically connected to the respective first source of each of the other first power sub-transistors of the plurality of first power sub-transistors at a common power source node; and
    wherein each respective first drain of each of the plurality of first power sub-transistors is electrically connected to the respective first drain of each of the other first power sub-transistors of the plurality of first power sub-transistors at a common first power drain node; and
a first distributed GaN pull-down switch formed on the substrate and including a plurality of first pull-down sub-transistors that each comprise a respective second gate, a respective second source, and a respective second drain;
    wherein each respective second gate of each first of the plurality of pull-down sub-transistors is electrically connected to the respective second gate of each of the other first pull-down sub-transistors of the plurality of first pull-down sub-transistors at a common first pull-down gate node;
    wherein each respective second source of each first of the plurality of pull-down sub-transistors is electrically connected to the respective second source of each of the other first pull-down sub-transistors of the plurality of first pull-down sub-transistors at a common first pull-down source node; and
    wherein each respective second drain of each first of the plurality of pull-down sub-transistors is electrically connected to the respective second drain of each of the other first pull-down sub-transistors of the plurality of first pull-down sub-transistors at the common first power gate node of the first distributed GaN power switch;
wherein each first pull-down sub-transistor of the plurality of first pull-down sub-transistors is physically adjacent a respective one of the first power sub-transistors of the plurality of first power sub-transistors;

a second distributed GaN power switch formed on the substrate, and including a plurality of second power sub-transistors that each comprise a respective third gate, a respective third source and a respective third drain;
    wherein each respective third gate of each of the plurality of the second power sub-transistor is electrically connected to the respective third gate of each of the other second power sub-transistors of the plurality of second power sub-transistors at a common second power gate node;
    wherein each respective third source of each of the plurality of the second power sub-transistor is electrically connected to the respective third source of each of the other second power sub-transistors of the plurality of second power sub-transistors at a common second power source node; and
    wherein each respective third drain of each of the plurality of the second power sub-transistor is electrically connected to the respective third drain of each of the other second power sub-transistors of the plurality of second power sub-transistors at a common second power drain node; and
a second GaN pull-down switch formed on the substrate, and including a plurality of second pull-down sub-transistors that each comprise a respective fourth gate, a respective fourth source and a respective fourth drain;
    wherein each respective fourth gate of each of the plurality of second pull-down sub-transistors is electrically connected to the respective fourth gate of each of the other second pull-down sub-transistors of the plurality of second pull-down sub-transistors at a common second pull-down gate node;
    wherein each respective fourth source of each of the plurality of second pull-down sub-transistors is electrically connected to the respective fourth source of each of the other second pull-down sub-transistors of the plurality of second pull-down sub-transistors at a common second pull-down source node; and
    wherein each respective fourth drain of each of the plurality of second pull-down sub-transistors is electrically connected to the respective fourth drain of each of the other second pull-down sub-transistors of the plurality of second pull-down sub-transistors at the common second power gate node; and
wherein the common second power source node of the second distributed GaN power switch is connected to the common first power drain node of the first distributed GaN power switch.

10. The electronic circuit of claim 9, wherein each second pull-down sub-transistor of the plurality of second pull-down sub-transistors is physically adjacent a respective one of the second power sub-transistors of the plurality of second pull-down sub-transistors.

11. The electronic circuit of claim 9, wherein each second power sub-transistor of the plurality of second power sub-transistors is physically adjacent a respective one of the second pull-down sub-transistors of the plurality of second pull-down sub-transistors.

12. The electronic circuit of claim 9, further comprising an interconnect structure between the plurality of second power sub-transistors and the plurality of second pull-down sub-transistors, wherein the interconnect structure is configured to electrically connect each respective third of the gate of each of the plurality of second power sub-transistors to each respective third the gate of each of the other plurality of the second power sub-transistors.

13. The electronic circuit of claim 9, further comprising an interconnect structure between the plurality of second power sub-transistors and the plurality of second pull-down sub-transistors, wherein the interconnect structure is configured to electrically connect each respective third gate of each of the plurality of second power sub-transistors to each respective fourth drain of each of the second pull-down sub-transistors of the plurality of second sub-transistors.

14. The electronic circuit of claim 9, further comprising an interconnect structure between the plurality of second power sub-transistors and the plurality of second pull-down sub-transistors, wherein the interconnect structure is configured to electrically connect each respective third source of each of the plurality of second power sub-transistors to each respective fourth source of each of the second pull-down sub-transistors of the plurality of second sub-transistors.

15. The electronic circuit of claim 9, wherein each of the plurality of second power sub-transistors has an identical orientation as the other each of the plurality of second power sub-transistors with respect to the substrate.

16. The electronic circuit of claim 9, wherein each of the plurality of second pull-down sub-transistors has an identical orientation as the other each of the plurality of second pull-down sub-transistors with respect to the substrate.

17. The electronic circuit of claim 9, wherein each respective third gate of each of the plurality of second power sub-transistors is electrically connected to a driver circuit that controls operation of the second GaN power switch between an on state and an off state, wherein when in the on state the second power drain node is connected to the second power source and when in the off state the second power drain node is electrically isolated from the second power source node.

18. The electronic circuit of claim 9, wherein each respective fourth gate of each of the plurality of the second pull-down sub-transistors is electrically connected to a first driver circuit that controls operation of the second GaN pull-down switch between an on state and an off state, wherein when in the on state the second GaN pull-down switch couples the second power gate node and the second pull-down source node causing the second distributed GaN power switch to be in an off state such that the second power drain node is substantially isolated from the second power source node;
and
wherein each respective third gate of the plurality of second power sub-transistors is electrically connected to a second driver circuit that controls operation of the second distributed GaN power switch between an on state and an off state, wherein in the on state the second power drain node is connected to the second power source node and when in the off state the second power drain node is electrically isolated from the second power source node.

* * * * *